(12) United States Patent
Burdick, Jr. et al.

(10) Patent No.: US 7,112,877 B2
(45) Date of Patent: Sep. 26, 2006

(54) HIGH DENSITY PACKAGE WITH WRAP AROUND INTERCONNECT

(75) Inventors: William Edward Burdick, Jr., Niskayuna, NY (US); James Wilson Rose, Guilderland, NY (US); Michael Anthony Rumsey, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/877,256

(22) Filed: Jun. 28, 2004

(65) Prior Publication Data
US 2005/0285264 A1 Dec. 29, 2005

(51) Int. Cl.
*H01L 23/48* (2006.01)
(52) U.S. Cl. .............. 257/686; 257/E23.191
(58) Field of Classification Search ......... 439/62, 439/67, 493, 492, 499, 801; 438/118, 106; 257/685, E23.151, E23.182, E23.191
See application file for complete search history.

(56) References Cited

U.S. PATENT DOCUMENTS

| 4,833,568 | A | * | 5/1989 | Berhold ............... 361/690 |
| 5,267,866 | A | | 12/1993 | Swift et al. |
| 5,575,661 | A | * | 11/1996 | Grabbe et al. ............ 439/62 |
| 6,046,410 | A | | 4/2000 | Wojnarowski et al. |
| 6,242,282 | B1 | | 6/2001 | Fillion et al. |
| 6,262,895 | B1 | * | 7/2001 | Forthun ............... 361/749 |
| 6,376,769 | B1 | * | 4/2002 | Chung ............... 174/52.2 |
| 6,396,153 | B1 | | 5/2002 | Fillion et al. |
| 6,623,418 | B1 | * | 9/2003 | Smith ............... 600/3 |
| 6,671,948 | B1 | | 1/2004 | Burdick, Jr. et al. |
| 6,879,032 | B1 | * | 4/2005 | Rosenau et al. ......... 257/696 |
| 2003/0067064 | A1 | * | 4/2003 | Kim ............... 257/686 |
| 2004/0012078 | A1 | * | 1/2004 | Hortaleza ............ 257/678 |
| 2004/0047135 | A1 | * | 3/2004 | Bando ............... 361/748 |

* cited by examiner

*Primary Examiner*—Carl Whitehead, Jr.
*Assistant Examiner*—Jennifer M. Dolan
(74) *Attorney, Agent, or Firm*—Jason K. Klindtworth; Jean K. Testa

(57) ABSTRACT

A high density electrical interconnecting system of the present invention has at least one substrate piece and a flexible wrap-around interconnect assembly extending from a first surface of the substrate piece to a second surface of the substrate piece wherein the flexible wrap-around interconnect is disposed around an outer surface of the substrate piece.

9 Claims, 2 Drawing Sheets

HIGH DENSITY PACKAGE WITH WRAP AROUND INTERCONNECT

BACKGROUND OF THE INVENTION

The invention relates to a high-density electronic interconnecting system wherein the physical characteristics of a supporting substrate are chosen according to predetermined electrical properties designed for the system. More particularly, the invention relates to flexible electrical interconnects based on substrates of selected physical properties.

Developments in miniaturization and microelectronics are resulting in electronic components having to rapidly interact and communicate with and respond to each other across microscopic electrical domains. Ball grid array (BGA) technology provides a high density of interconnections per unit area, but mismatches of coefficients of thermal expansion (CTEs) occur when ceramic, silicon, or polymer BGA substrates and printed circuit boards are joined and often result in cracked joints, especially as the size of the substrates and temperature ranges are increased. Besides, the interconnects cannot be designed to a pitch (i.e. the closest separation between two adjacent interconnects) of less than about 50 microns. At very fine pitch, from practical considerations, the interconnect cannot pass through the core of the substrate.

Accordingly, there is a need for innovative packaging techniques capable of providing a high density system of interconnects wherein the interconnects are positioned atop or across the surfaces of a substrate without penetrating the substrate. It is also desirable that the interconnects be provided in close proximity of each other to provide a pitch of about 50 microns or less. It is also desirable that the physical characteristics of the substrates are selected according to predetermined electrical requirements of capacitance, dielectric constant and impedance, among other criteria. It is also desirable for the substrates to be configured to be coupled to each other so as to provide minimal or no clearance between adjoining substrates thereby providing a high-density packaging system of flexible interconnects.

BRIEF SUMMARY OF THE INVENTION

One embodiment of the present invention provides a high density electrical interconnecting system comprising at least one substrate and a flexible wrap-around interconnect extending from a first surface of the substrate to a second surface of the substrate wherein the flexible wrap-around interconnect is disposed around an outer surface of the substrate.

A second embodiment of the present invention is to provide an array having a high density electrical interconnecting system comprising a plurality of substrates and a flexible wrap-around interconnect extending from a first surface of a respective one of the plurality of substrates to a second surface of a respective one of the plurality of the substrates wherein the flexible wrap-around interconnect is disposed around an outer surface of the plurality of substrates.

These and other embodiments, aspects, advantages, and salient features of the present invention will become apparent from the following detailed description, the accompanying drawings, and the appended claims.

BRIEF DESCRIPTION OF THE DRAWINGS

Referring now to the figures wherein like elements are numbered alike.

DETAILED DESCRIPTION OF THE INVENTION

Figure 1:
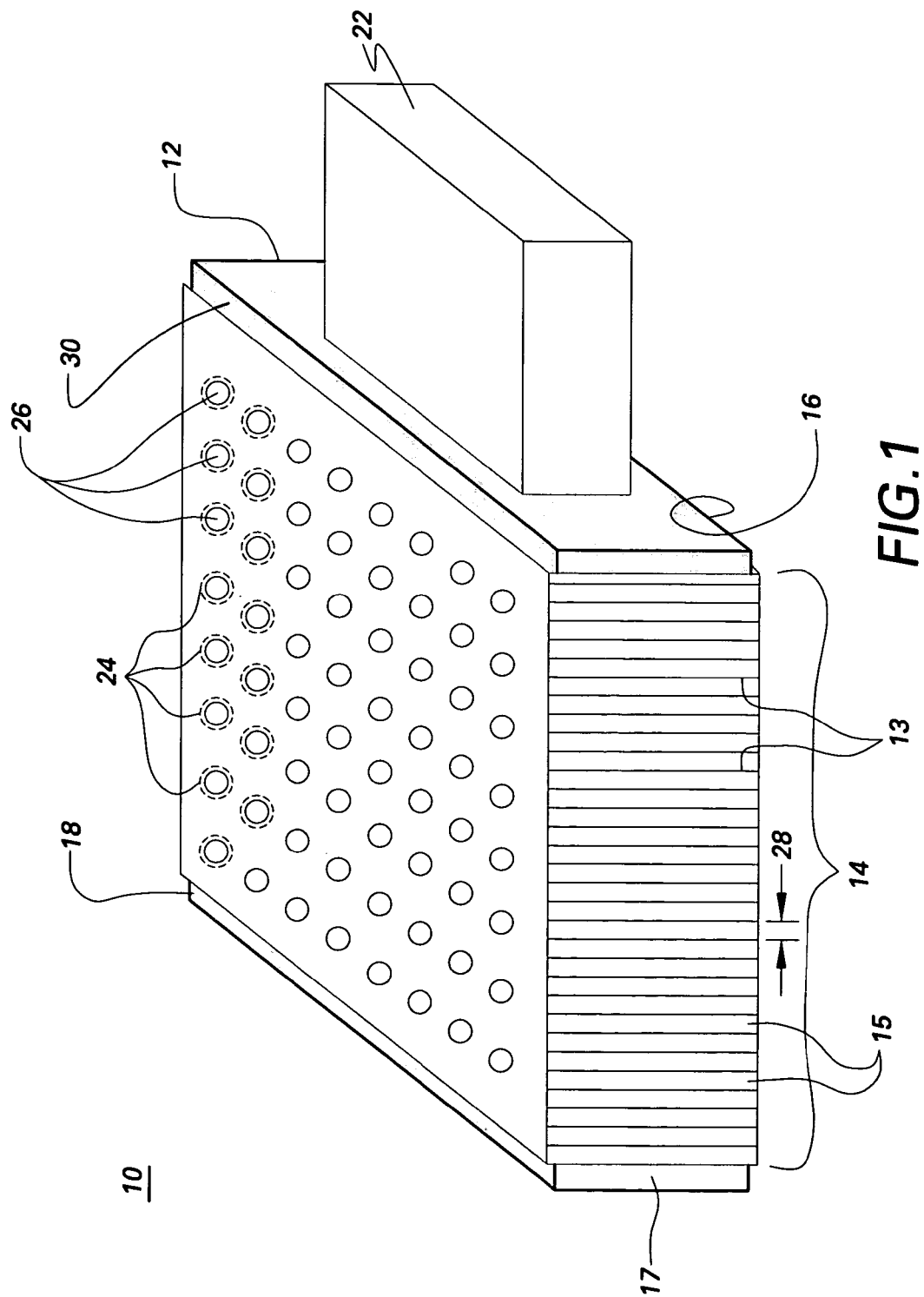
FIG. 1 is a schematic view illustrating an embodiment of the high density electrical interconnecting system of the present invention.

In the following description, like reference characters designate like or corresponding parts throughout the several views shown in the figures. It is also understood that terms such as "top," "bottom," "front," "rear," and the like are words of convenience used for describing the invention with respect to the illustrations and are not to be construed as limiting terms or mandating a particular orientation of devices made in accordance with the invention.

Referring to the drawings in general and to FIG. 1 in particular, it will be understood that the illustrations are for the purpose of describing a preferred embodiment of the invention and are not intended to limit the invention thereto.

According to one embodiment of the present invention a high density electrical interconnecting system 10 comprises at least one substrate piece 12 and a flexible wrap-around interconnect assembly 14 extending from a first surface 16 of the substrate 12 to a second surface 18 of the substrate such that flexible wrap-around interconnect assembly 14 is disposed around an outer surface of the substrate 12. "Outer surface", as used herein, refers to an exterior surface of substrate 12; that is, an upper, lower, or side surface of the substrate. By way of example and not limitation, in FIG. 1 first surface 16 can be identified as the lower exterior surface of the substrate, and second surface 18 as the upper exterior surface; similarly, side surface 17 also is an exterior surface of substrate 12. "Flexible", as used herein, refers to the ability of the interconnect assembly 14 to be disposed around one or more outer surfaces of the substrate 12 such that the interconnect assembly 14 conforms to the contour of the substrate outer surfaces on which it is disposed. As such, interconnect assembly 14 is disposed such that it wraps around those substrate surfaces on which it is disposed. The flexible wrap-around interconnect 14 comprises a plurality of electrical conductor elements 13 and substructure material 15 on which they are imbedded (as described more fully below); interconnect assembly 14 extends from at least one first contact point (not visible in view of FIG. 1) on a first surface 16 of the substrate 12 to at least one second contact point 26 on the second surface 18 of the substrate 12 by extending across outer surfaces of substrate 12. For ease of illustration, in FIG. 1 conductive elements 13 and the substructure material 15 is identified only in that portion of interconnect assembly 14 disposed along substrate side surface 17; it will be understood, however, that such structure further extends across first surface 16 and second surface 18 such that respective ones of the conductive elements are electrically coupled to respective ones of the contact points 26 disposed on the first and second surfaces of substrate 12. An active device (not illustrated), such as a photodiode, sensor, or the like, will typically be disposed on the interconnect 14 surface that is disposed on surface 18 of substrate 12. It will be understood by those skilled in the art, that such active device will have a plurality of electrical contact points 24 (illustrated in phantom in FIG. 1) that are disposed to be electrically coupled to contact points 26 of flexible interconnect 14. Flexible interconnect 14 will thus provide an electrical path between the active device contact points 24 through the conductive elements 13 to portions of the interconnect 14 disposed on substrate first surface 16; electrical connections from this portion of interconnect 14 can then be made to other devices or to conduits beyond the substrate structure.

In one embodiment of the present invention, the flexible wrap-around interconnect assembly 14 extends from a first surface 16 of the substrate 12 to a second surface 18 of the substrate 12 without physical penetration of substrate 12. As used herein, the term 'without physical penetration of substrate 12 refers to flexible wrap-around interconnect assembly 14 being substantially positioned along the outer surfaces of the substrate without passing through the body of substrate 12 or passageways interior to the body of substrate 12, such as a channel through the substrate directly between first surface 16 and second surface 18. Placement of interconnect assembly 14 around the outer surfaces of substrate 12 thus does not impair or compromise the structural integrity of substrate 12 and also facilitates ease of fabrication. Typically, the flexible wrap-around interconnect 14 is mechanically anchored to substrate 12 with an adhesive applied to one or more substrate surfaces, thus prevent sliding or slippage of the interconnect assembly.

The substrate 12 desirably has selected physical characteristics appropriate for the intended use and operating conditions of the assembled device and further is configured to be coupled to at least one additional substrate. Additionally, the electrical properties of an interconnecting system are commonly closely linked to the mechanical properties of the substrate supporting the electrical components. For example, the selection of the substrate material determines characteristics such as electrical capacitance, impedance, resistance, semi-conducting properties, dielectric constant, which can singly or in combination effect the electrical performance of the assembled device. As a result of the present invention, the material to form substrate 12 may be chosen to provide both desired mechanical properties and electrical properties, without being constrained by issues of mechanical strength dictated by the prior art approach of drilling interconnect passageways through the body of substrate 12. Desired mechanical characteristics typically considered include size, shape, weight, dimensional tolerance, strength, thickness, thermal conductivity, thermal expansion, and combinations thereof. Substrate 12 typically has a regular geometric profile such as a cube, a trapezoid or a rectangular section. In some embodiments, substrate 12 has a complex shape, that is, an irregular substrate shape that cannot be described in terms of conventionally known geometries. Substrate 12 is typically machined, milled, molded, or extruded to create a mechanical frame on which flexible wrap-around interconnect assembly 14 is disposed. The substrate material is chosen as needed to support the mechanical, thermal and electrical requirements of the packaged devices. The flexible wrap-around interconnect assembly 14 is fabricated to provide desired electrical interconnections between electrical contacts 26 disposed on one surface of the substrate to a second surface of the substrate, typically between opposite sides of the substrate.

Figure 2:
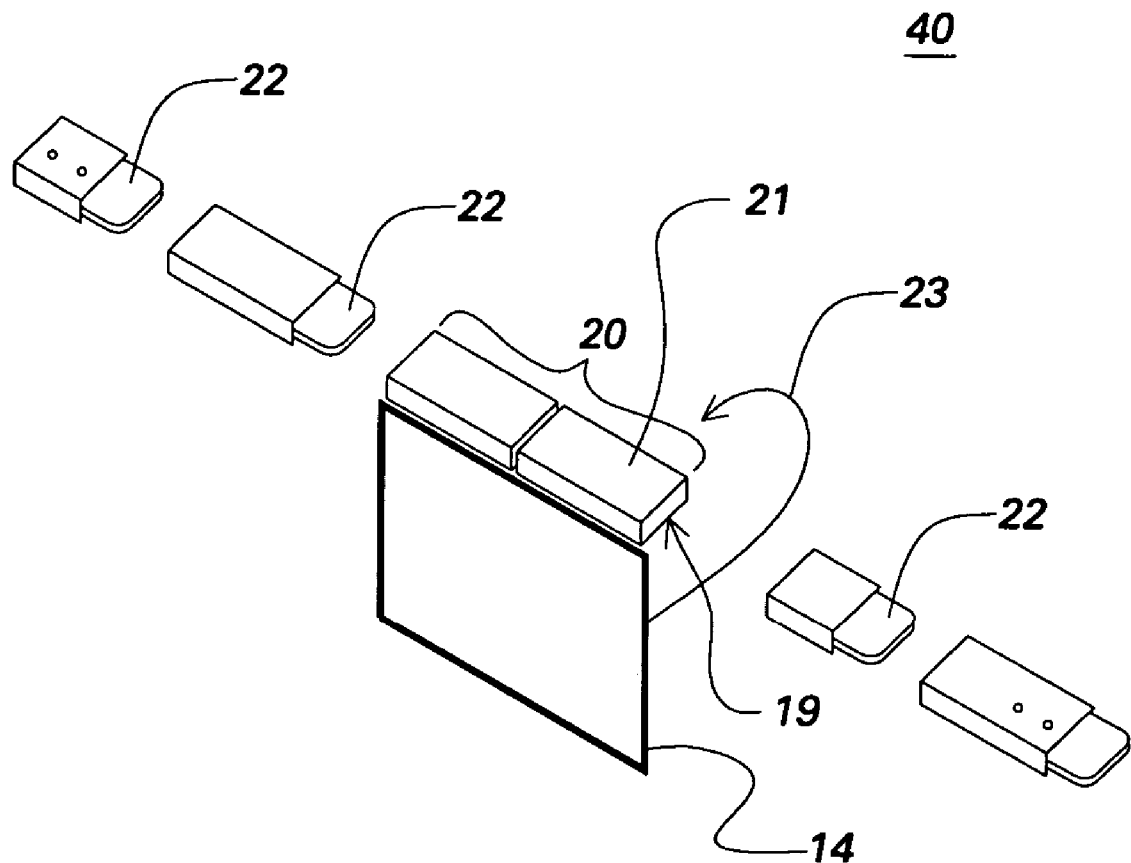
FIG. 2 is a schematic view illustrating an embodiment of an array having a high density electrical interconnecting system.

Respective ones of substrate pieces 12 desirably are configured to be coupled to adjacent substrate pieces. As used herein, the term 'configured to be coupled to' refers to structural elements on respective pieces of substrate that enable adjacent or adjoining substrates to be structurally wedged or interlocked into one another using a variety of mechanical joints such as a tongue-and-groove joint 22 (groove portion not visible in FIG. 2). Other connection types (not illustrated in the figures) may commonly be used, such as a dovetail joint, a lap joint, a ball-and-socket joint, and combinations thereof. When coupled together, respective substrate pieces 12 are combined to for a substrate assembly 20 (FIG. 2) that provides desired mechanical strength and size. Wrap-around interconnect assembly 14 is typically disposed on the non-coupling surfaces of the substrates such that the substrate pieces closely fit into one another and no portion of flexible wrap-around interconnect 14 is disposed in-between the coupling faces of the substrates, enabling the substrate pieces to be closely assembled so as to provide high-density packaging of electronic components disposed on the substrates. Additionally, interconnect assembly 14 is readily sized so as to correspond to the dimensions of an assembled substrate assembly 20 (FIG. 2). Interconnect assembly 14 thus may be attached to a first surface 19 of substrate assembly 20 and disposed around the substrate assembly (in the direction of arrow 23 in FIG. 2) to a second surface 21 of substrate assembly 20.

In one aspect of the present invention, interconnect assembly 14 is disposed on adjacent surfaces of substrate 12 (not illustrated). In another, more common, embodiment, interconnect assembly 14 across disposed on non-adjacent surfaces of substrate 12. Substrate 12 typically comprises a material such as glass, ceramic, plastic, metal, paper, polymer, composite, or combinations thereof. Metal substrate material commonly comprises at least one of copper, aluminum, nickel, platinum, gold, silver, palladium, and combinations thereof.

Flexible wrap-around interconnect 14 provides a plurality of electrical conductor elements 13 extending from a first contact terminus 26 coupled to the active device (not illustrated)contact points 24 on a first surface 16 of the substrate 12 to a contact terminus 26 on the second surface 18 of the substrate 12 by extending around an outer surface of the substrate 12. Flexible interconnect assembly substratum material 15 typically comprises at least one of Kapton®, polyimide, polyethylene, polypropylene, Ultem® polyetherimide, flexible printed circuit, and combinations thereof. Electrical conductive elements 13 typically comprise metal solder traces, nanowires, conducting polymer ribbon, and combinations thereof. The pitch 28 of conducting elements 13 (shown in FIG. 1) is understood to mean the translational distance between one conducting element and the adjoining conducting element (e.g., the distance between one nanowire and the next nanowire). A lower pitch hence implies more closely positioned interconnects. Interconnect assembly 14 typically has a pitch of between about 5 microns and about 50 microns.

In another embodiment of the present invention, an array 40 having a high density electrical interconnecting system 10 comprising a plurality of substrates 12 and a flexible wrap-around interconnect 14 extending from a first surface 16 of a respective one of the plurality of substrates 12 to a second surface 18 of a respective one of the plurality of substrates 12 wherein the flexible wrap-around interconnect 14 is disposed around an outer surface of the plurality of the substrates 12 is provided. An exemplary representation is shown in FIG. 2.

In one aspect of the present invention, flexible wrap-around interconnect 14 extends from a first surface 16 of a respective one of the plurality of substrates 12 to a second surface 18 of a respective one of the plurality of substrates 12 without physical penetration of the respective one of the plurality of substrates 12. In a second aspect of the invention, the array 40 is comprises radiation detection devices, transducers, or the like such as may be used in an X-ray system or an ultrasound system used in medical or industrial imaging.

The flexible wrap-around interconnecting system disclosed in this invention enables the fabrication of high-density tileable sensor arrays.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

What is claimed is:

1. An array having a high density electrical interconnecting system comprising:
   a) a plurality of substrate pieces;
   b) a first flexible wrap-around interconnect assembly extending from a first surface of a first substrate piece to a second surface of the first substrate piece wherein said flexible wrap-around interconnect is disposed around an outer surface of said first substrate piece; and
   a second flexible wrap-around interconnect assembly extending from a first surface of a second substrate piece to a second surface of the second substrate piece wherein said second flexible wrap-around interconnect is disposed around an outer surface of second substrate piece; wherein said first substrate piece is coupled to the second substrate piece at a coupling surface and the first and second flexible wrap-around interconnect assemblies are positioned along non-coupling surfaces of the respective substrate pieces such that the wrap-around interconnect assemblies are physically isolated from each other.

2. The array according to claim 1, wherein said first wrap-around interconnect assembly extends from the first surface of the first substrate piece to the second surface of the first substrate piece without physical penetration of the first substrate piece, and sold second wrap-around interconnect assembly extends from the first surface of the second substrate piece to the second surface of the second substrate piece without physical penetration of the second substrate piece.

3. The array according to claim 2, wherein said first surface and said second surface are disposed opposite one another.

4. The array according to claim 1, wherein said first and second flexible wrap-around interconnect assemblies comprise a substratum material selected from the group consisting of polyimide, polyethylene, polypropylene, flexible printed circuit, and combinations thereof.

5. The array according to claim 1, wherein said first and second wrap-around interconnect assemblies comprise metal contact points on each of said first surface and said second surface.

6. The array according to claim 1, wherein said array has a pitch of about 5 microns to about 50 microns.

7. The array according to claim 6, wherein said first and second interconnect assemblies comprise a plurality of conductive elements, said conductive elements comprising a material selected from the group consisiting of metal solder traces, nanowires, conducting polymer ribbon, and combinations thereof.

8. The array according to claim 1, wherein said high density electrical interconnecting system has electrical properties comprising at least one of capacitance, impedance, resistance, semi-conducting property, dielectric constant, and combinations thereof.

9. The array according to claim 1, wherein said array is coupled to at least one of an X-ray system or an ultrasound system.

* * * * *